United States Patent

Aubertine et al.

Patent Number: 5,544,088
Date of Patent: Aug. 6, 1996

[54] METHOD OF I/O PIN ASSIGNMENT IN A HIERARCHIAL PACKAGING SYSTEM

[75] Inventors: Matthew E. Aubertine, Austin, Tex.; Kianoush Beyzavi, Cary, N.C.; Harold J. Broker, Ulster Park, N.Y.; Ronald P. Checca, LaGrangeville, N.Y.; Michael A. Granato, Poughkeepsie, N.Y.; David A. Haeussler, Cary, N.C.; Michael Herasimtschuk, Poughkeepsie, N.Y.; Michael J. Jurkovic, Lagrange, N.Y.; Gerard M. Salem, Highland, N.Y.; Craig R. Selinger, Spring Valley, N.Y.; Paul R. Zehr, Claverack, N.Y.

[73] Assignee: International Business Machines Corporation, Armonk, N.Y.

[21] Appl. No.: 492,415

[22] Filed: Jun. 19, 1995

Related U.S. Application Data

[63] Continuation of Ser. No. 82,129, Jun. 23, 1993, abandoned.

[51] Int. Cl.$^6$ ............................. G06F 15/17; G06F 11/26
[52] U.S. Cl. ........................ 364/489; 395/309; 364/490; 364/491
[58] Field of Search ............................. 395/800, 309, 395/299, 730, 732, 185.09, 739, 54, 600; 365/222; 364/490, 488, DIG. 2, DIG. 1, 578, 580, 712, 489, 491; 340/825.5; 370/85.2

[56] References Cited

U.S. PATENT DOCUMENTS

| | | | |
|---|---|---|---|
| 3,603,771 | 9/1971 | Isett et al. | 364/491 |
| 3,702,004 | 10/1972 | Eskew et al. | 364/490 |
| 4,500,963 | 2/1985 | Smith et al. | 364/489 |
| 4,577,276 | 3/1986 | Dunlop et al. | 364/491 |
| 4,752,887 | 6/1988 | Kuwahara | 364/491 |
| 4,852,015 | 7/1989 | Doyle, Jr. | 364/489 |
| 4,852,016 | 7/1989 | McGehee | 364/491 |
| 4,855,929 | 8/1989 | Nakajima | 364/490 |
| 4,890,238 | 12/1989 | Klein et al. | 364/491 |
| 4,967,367 | 10/1990 | Piednoir | 364/490 |
| 5,046,017 | 9/1991 | Yuyama et al. | 364/491 |
| 5,119,317 | 6/1992 | Narikawa et al. | 364/512 |
| 5,151,868 | 9/1992 | Nishiyama et al. | 364/490 |
| 5,168,455 | 12/1992 | Hooper | 364/490 |
| 5,187,668 | 2/1993 | Okude et al. | 364/491 |
| 5,191,542 | 3/1993 | Murofushi | 364/491 |
| 5,229,953 | 7/1993 | Isozak et al. | 364/490 |
| 5,231,589 | 7/1993 | Itoh et al. | 364/490 |
| 5,231,590 | 7/1993 | Kumar et al. | 364/489 |
| 5,272,645 | 12/1993 | Kanakami et al. | 364/488 |

Primary Examiner—Daniel H. Pan
Attorney, Agent, or Firm—Lynn L. Augspurger; Richard L. Aitken

[57] ABSTRACT

A method is provided to assign component I/O (input/output, the interface area between levels of physical packaging) pins for all components at each level of the computer system. In a hierarchical, top-down design methodology, the I/O pins for each computer system component are assigned to nets (a net is an interconnection of pins on a level of packaging, or between levels of packaging) based on wire length, electrical limits and timing. Parameters that are considered are net priority (the importance of this net to the system, relative to other nets in the system), location of physical components, location of physical component I/Os at all computer system levels of physical packaging hierarchy, and I/O pin characteristics. An iterative method is used to assign and reassign I/O pins at each level based on timing. As I/Os are reassigned at each lower component level, new assignments are made at all higher levels of the system packaging hierarchy based on the changed parameters at the lower level. I/Os assignment by this method for a computer system package design reduces the occurance of any critical nets failing length, electrical or timing constraints due to poor I/O assignments. The method has built in checks to avoid being trapped in an NP complete situation (a form of endless loop).

12 Claims, 10 Drawing Sheets

FIG.1

FIG.2 x = CHIP COMPONENT I/O
0 = MODULE COMPONENT I/O

TABLE 1:

| NETS | ACTUAL WIRE | WIRE LIMIT | LEGAL |
|---|---|---|---|
| A | 2mm | 8mm | YES |
| B | 2mm | 9mm | YES |
| C | 2mm | 3mm | YES |
| D | 2mm | 5mm | YES |
| E | 6mm | 4mm | NO |
| F | 6mm | 3mm | NO |

FIG.3A x = CHIP COMPONENT I/O
0 = MODULE COMPONENT I/O

TABLE 2:

| NETS | ACTUAL WIRE | WIRE LIMIT | LEGAL |
|---|---|---|---|
| C | 2mm | 3mm | YES |
| F | 3mm | 3mm | YES |
| E | 3mm | 4mm | YES |
| D | 2mm | 5mm | YES |
| A | 7mm | 8mm | YES |
| B | 7mm | 9mm | YES |

FIG.3B

TABLE 1:

| NET NAME | TIMING LIMITS | ACTUAL TIMING | LEGAL |
|---|---|---|---|
| A | 100-150ps | | |
| B | 100-150ps | | |
| C | 150-200ps | | |
| D | 150-200ps | | |
| E | 200-250ps | | |
| F | 200-250ps | | |

TABLE 2:

| NET NAME | TIMING LIMITS | ACTUAL TIMING | LEGAL |
|---|---|---|---|
| A | 100-150ps | 110ps | YES |
| B | 100-150ps | 160ps | NO |
| C | 150-200ps | 170ps | YES |
| D | 150-200ps | 190ps | YES |
| E | 200-250ps | 200ps | YES |
| F | 200-250ps | 250ps | YES |

TABLE 3:

| NET NAME | TIMING LIMITS | ACTUAL TIMING | LEGAL |
|---|---|---|---|
| B | 100-150ps | 140ps | YES |
| A | 100-150ps | 130ps | YES |
| C | 150-200ps | 170ps | YES |
| D | 150-200ps | 190ps | YES |
| F | 200-250ps | 240ps | YES |
| E | 200-250ps | 220ps | YES |

FIG.4

TABLE 1:

| NETS | WIRE LIMIT | TIMING LIMIT | TIMING |
|---|---|---|---|
| A | 3mm | 100-150ps | |
| B | 3mm | 100-150ps | |
| C | 3mm | 100-150ps | |
| D | 4mm | 150-200ps | |
| E | 4mm | 150-200ps | |
| F | 4mm | 200-250ps | |
| G | 4mm | 200-250ps | |
| H | 4mm | 200-250ps | |

TABLE 2:

| NETS | WIRE LIMIT | TIMING LIMIT | TIMING |
|---|---|---|---|
| B | 3mm | 100-150ps | 90ps |
| A | 3mm | 100-150ps | 110ps |
| C | 3mm | 100-150ps | 120ps |
| E | 4mm | 150-200ps | 150ps |
| D | 4mm | 150-200ps | 160ps |
| H | 4mm | 200-250ps | 190ps |
| F | 4mm | 200-250ps | 200ps |
| G | 4mm | 200-250ps | 220ps |

TABLE 3:

| NETS | WIRE LIMIT | TIMING LIMIT | TIMING |
|---|---|---|---|
| B | 3mm | 100-150ps | 100ps |
| A | 3mm | 100-150ps | 105ps |
| C | 3mm | 100-150ps | 120ps |
| E | 4mm | 150-200ps | 155ps |
| D | 4mm | 150-200ps | 155ps |
| H | 4mm | 200-250ps | 210ps |
| F | 4mm | 200-250ps | 200ps |
| G | 4mm | 200-250ps | 210ps |

TABLE 1:

| NET NAME | LENGTH | TIMING | NEW LENGTH | NEW TIMING |
|---|---|---|---|---|
| A | 400mm | 500ps | 380mm | 380ps |
| B | 420mm | 510ps | 410mm | 440ps |
| C | 380mm | 490ps | 370mm | 420ps |
| D | 350mm | 400ps | 400mm | 700ps |
| E | 200mm | 300ps | 200mm | 300ps |
| F | 210mm | 290ps | 210mm | 290ps |

METHOD OF I/O PIN ASSIGNMENT IN A HIERARCHIAL PACKAGING SYSTEM

This application is a continuation of application Ser. No. 08/082,129, filed Jun. 23, 1993, now abandoned.

FIELD OF THE INVENTION

This invention relates to a circuit layout for the physical design of computer system components, and particularly to a method of assigning I/O pins for physical package design wherein all nets at each level of the computer system are assigned component I/O pins based on estimated wire length, electrical constraints and timing.

GLOSSARY OF TERMS

While dictionary meanings are also implied by certain terms used here, the following glossary of some terms may be useful.

I/O pins

Input/Output wires leading to or from a component of a computer system.

Net

A net is an interconnection of pins on a level of packaging, or between levels of packaging.

NP

NP is a form of endless loop. An NP complete situation is a situation in which an endless loop of this form is complete.

inter-hierarchical relationships

Inter-hierarchical relationships are relationships between levels of the packaging hierarchy.

hierarchical packaging system

A hierarchical packaging system is a system for constructing a computer system whereby many lower level packages are attached to a higher level package(s) and communicate with each other via the higher level package(s). An example of this is 10 computer chips being mounted on a single board, and communicating via wires contained within the single board. The chips are the lower level packages and the board is the higher level package. The number of levels in the hierarchy is unlimited.

direction of flight

The direction of flight is the direction that a wire takes such that the distance between the driving pin and receiving pin of the wire is minimized. The wire starts at the driving pin and travels in the direction of the receiving pin. The direction of flight is constrained to a single packaging level.

direction of flight at the next level

The direction of flight at the next level refers to the direction a wire travels from the driving pin to the receiving pin on the next packaging level in a hierarchical packaging system. The direction of flight at the next level may be different from the direction of flight for any given net.

net priorities

Net priorities refers to the priority assigned to any given net. Each net is assigned a priority. The priority may or may not be unique. The priority assigned is determined by the criticality of the net. net.

vector average

The vector average of a net refers to an average direction of flight of a net that has more than one receiving pin. Vector algebra is used to determine the average direction to the receiving pins.

EC

EC stands for Engineering Change. An EC is performed on a piece of hardware after the piece of hardware is manufactured. Certain elements of a computer system have the property of being ECable, while other elements a not ECable, or nonECable.

ECable I/Os

The term ECABLE refers to the ability one has to physically change a manufactured item. ECable I/Os are I/O pins that, after being physically connected to a net, can be removed from the original net and attached to a different net.

nonECable I/Os

A nonECable I/O is one that, after manufacturing, is impossible to physically alter by removing it from an existing net, or adding it to a new or changing net. Non-ECable I/Os are said to be fixed after manufacturing.

higher and lower level packages

The highest level package is the singal package upon which all other packages either directly or indirectly reside. The lowest level package is the package or set of packages upon which no other package resides.

TCMs

A TCM is a Thermal Cooled Module upon which computer chips reside. Wires exist within the TCM such that the computer chips may be interconnected with each other. I/O pins exist on the TCM such that computer chips may communicate with other computer chips or devices that are not resident upon the said TCM.

MCMs

MCM stands for Multiple Chip Module. Like the TCM, the MCM is a device upon which computer chips reside. The MCM has internal wires allowing the computer chips resident on the MCM to communicate with each other. The MCM has I/O pins allowing computer chips resident on the MCM to communicate with computer chips and devices not resident on the MCM. MCMs are more than 1 MCM. (plural form of MCM)

BACKGROUND OF THE INVENTION

As background for our invention in IBM Technical Disclosure Bulletin Vol. 25, No. 3b, August 1982, entitled "I/O Pin Assignment in a Computer", there is described a method of assigning component I/O pins for physical package design based on timing information. Described is the prioritizing of nets based on timing and assigning component I/Os based on this priority. This assignment procedure has been incorporated in such tools as the IBM SHUFFLE.

A limitation of this prior method is that net priority is established exclusively by timing information. Consideration was not provided for assigning component I/O pins based on estimated wire length, or electrical constraints which in turn may affect timing.

This method results in many illegal and/or non-optimized nets, necessitating re-assignment of I/Os at one or more levels of the computer system.

The shortcomings of the prior art techniques have made it necessary to develop a comprehensive method to effectively assign component I/Os at all levels of a computer system for any technology.

SUMMARY OF THE INVENTION

Our invention deals with a method for providing a hierarchical, physical design, top-down methodology for assignment of the location of component I/O pins across an entire computer system.

Assignments are done iteratively across the system, re-assigning I/Os at each level of packaging based on the net priority established by timing information. The method starts with the highest level of packaging and moves to the next lower level as assignments of I/Os are stabilized at the higher level.

In accordance with our method of assignment of component I/O pins to nets across all levels of physical hierarchy of a computer system the number of illegal nets (nets that do not meet any or all of the timing, logical, physical or electrical constraints) will be greatly reduced. This process eliminates, or greatly reduces, the interactive efforts involved in reassigning I/Os to eliminate illegal nets.

The invention also, as a result of the process to be described, can reduce the overall net wire length. This process will thus improve packaging wireability, since less total wire is required to be routed.

The total system timing is optimized. This process will thus aid in the ease of achieving system timing goals, as well a provide an effective means for exceeding system timing goals, thus potentially yielding a higher performance machine then was originally targeted.

These and other improvements are set forth in the following detailed description. For a better understanding of the invention with advantages and features, refer to the description and to the drawings.

BRIEF DESCRIPTION OF THE DRAWINGS

The detailed description explains the preferred embodiments of our invention, together with advantages and features, by way of example with reference to the following drawings.

DETAILED DESCRIPTION OF THE INVENTION

Figure 1:
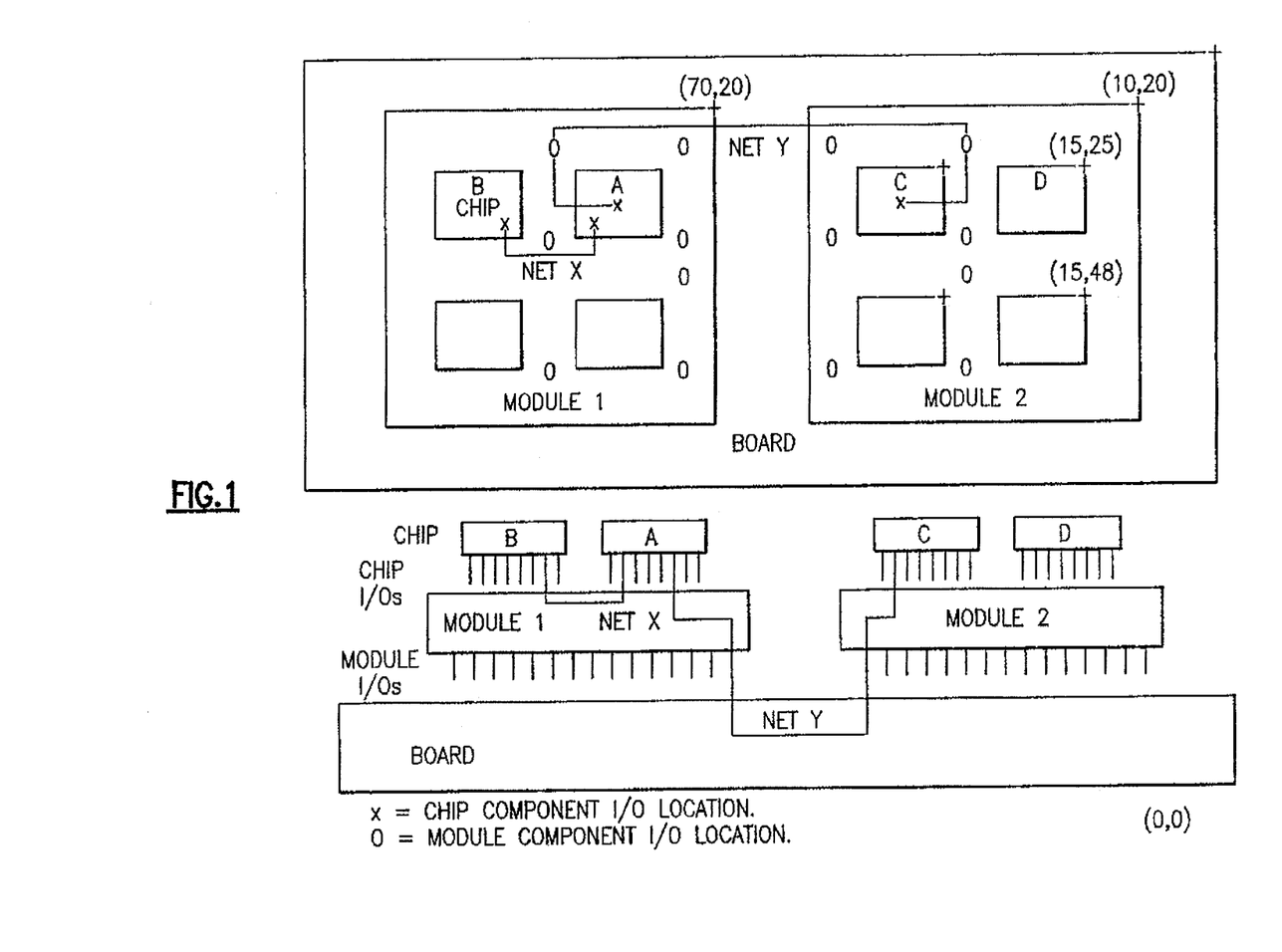
FIG. 1 shows a three component level system (chip/module/board) and how the component I/Os are used to interface with the next higher level components to establish connections between components and between levels of components in a computer system.

Before considering our preferred embodiments in detail, it maybe helpful to understand in a general form the problems that are to be solved by use of these methods and algorithms. As an illustration, FIG. 1 shows a three component level system of chip, module and board. For communication to be established between CHIP A and B in FIG. 1, two chip component I/Os, one of CHIP A and one of CHIP B, have to be assigned to the wire connecting CHIP A to CHIP B. FIG. 1 further illustrates that for a connection between CHIP A and CHIP C (two chips placed on different modules) to be established, component I/O pins from MODULE A and MODULE B also have to be assigned.

In selecting the component I/Os at the different levels of the system for assignment to nets, design constraints that are established for these nets must be obeyed. The overall purpose in establishing these design constraints is to ensure the maximum amount of time a signal has to travel across a net is not exceeded, causing the design to work improperly.

One parameter that effects timing is wire length. The longer the wire length, the greater the amount of time that is required for a signal to travel across the wire. To make communication between two components as fast as possible, the wire length must be kept to a minimum.

As a rule, to ensure the timing limit is not violated, the wire length of any net segment is to be kept as short as possible. Assigning an I/O implicitly establishes the length of a net segment and therefore, must be done with the goal of minimizing wire length.

Figure 2:
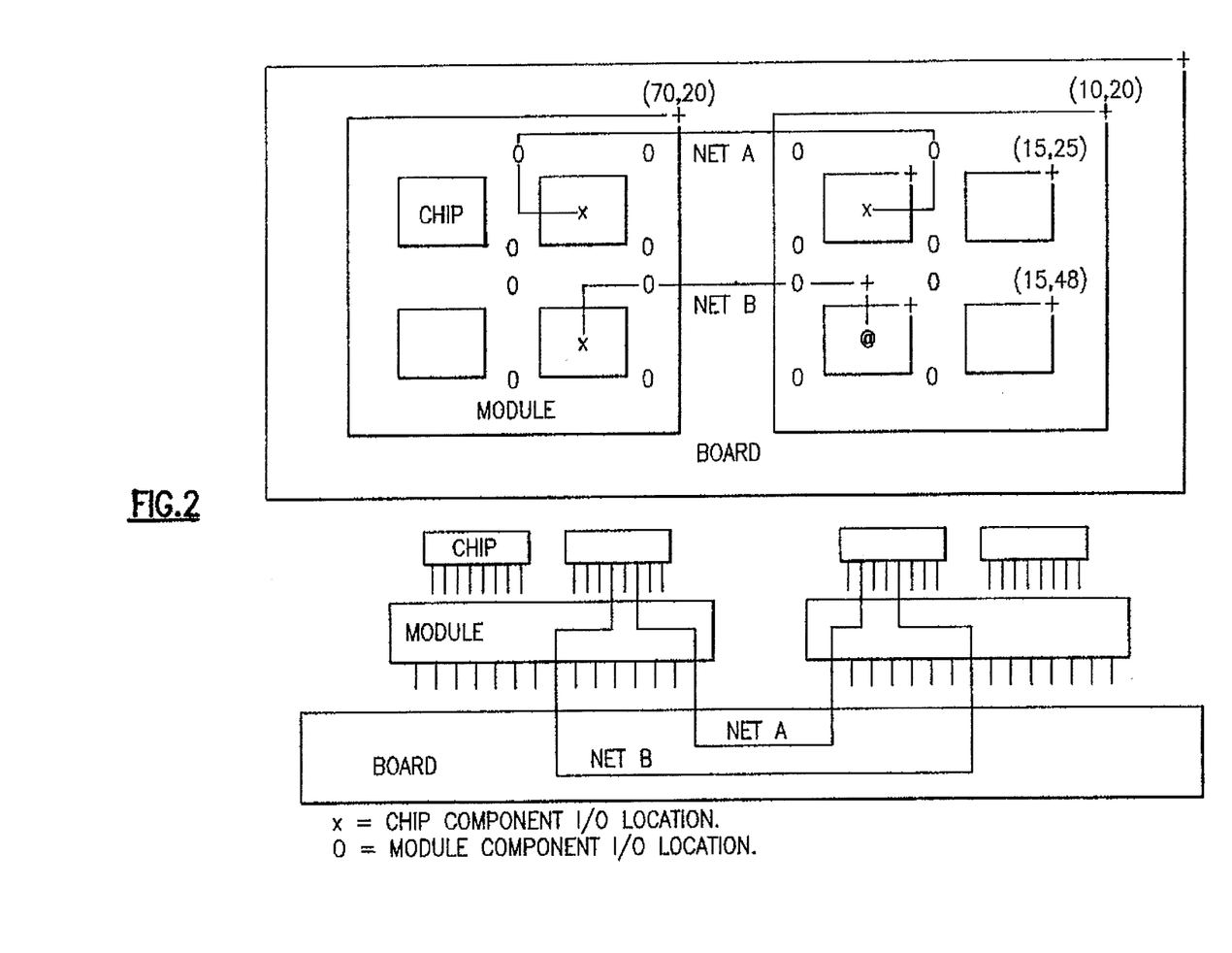
FIG. 2 shows additional wire length that is realized if a poor estimate of the initial location of a component I/O is given.

FIG. 2 illustrates the differences between a good and poor assignment of module I/Os. It will be seen how FIG. 2 illustrates knowing the overall direction and path of a connection can improve the assignment of package I/Os and reduce the amount of wire needed to make a connection knowing net source/sink.

Net B has a greater length because a component I/O at the module level was chosen without regard to the source and sink points of the net.

Net A has a shorter length as the algorithm to calculate the overall length of a net has the source and sink points of the net and selects a module component I/O to minimize net length.

The wire connection for NET A is assigned module I/Os that are consistent with the direction in which the connection is to be made. By comparison, NET B is assigned module I/Os that are located in a direction counter to the shortest path the connecting wire would have to travel. The result is that NET A has less wire and will meet a more restrictive design constraint than NET B.

Figure 3A:
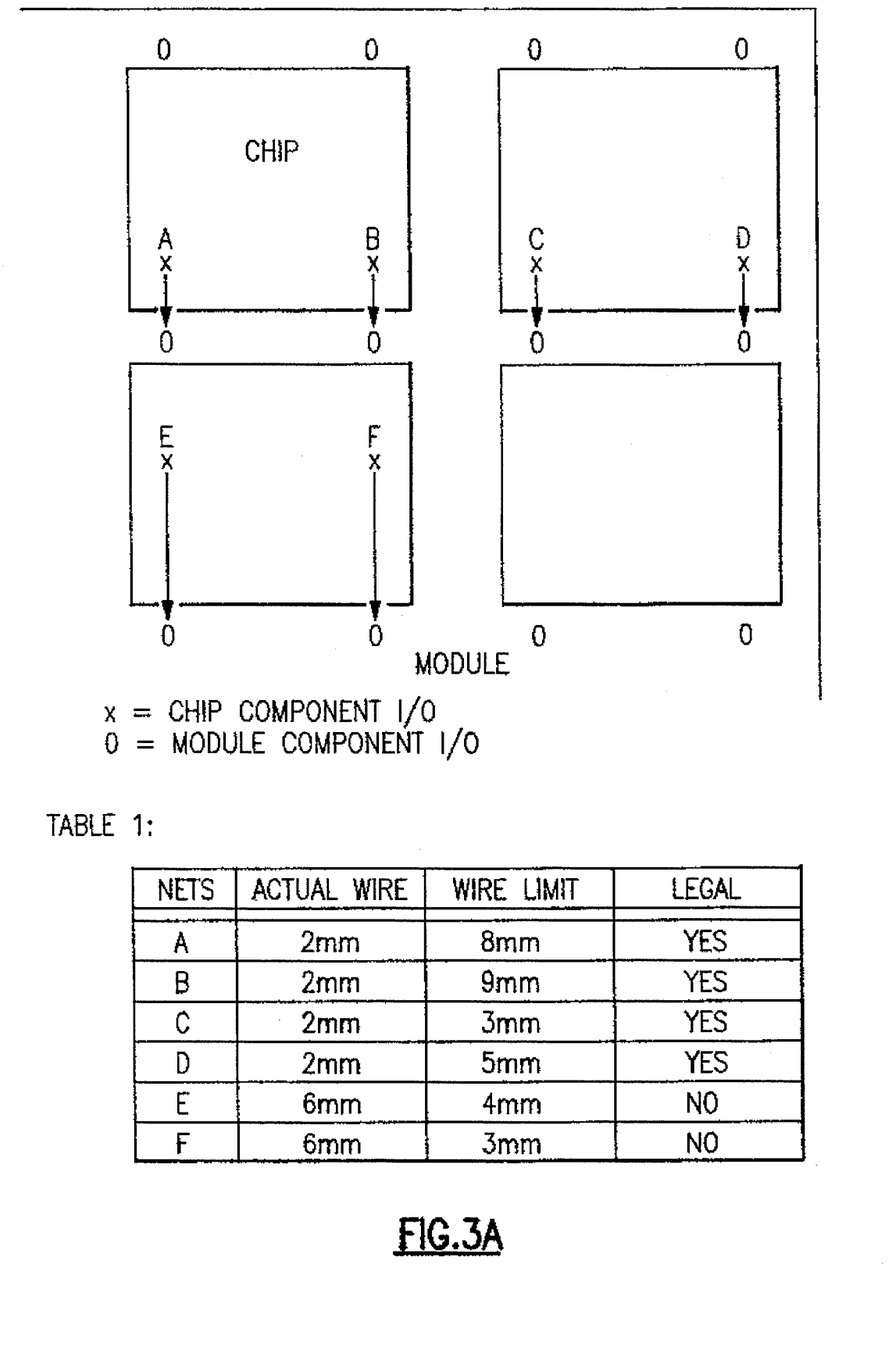
FIGS. 3A and 3B show that nets assigned I/Os using the wiring length limit as a priority can reduce the number of nets violating that limit.
Figure 3B:
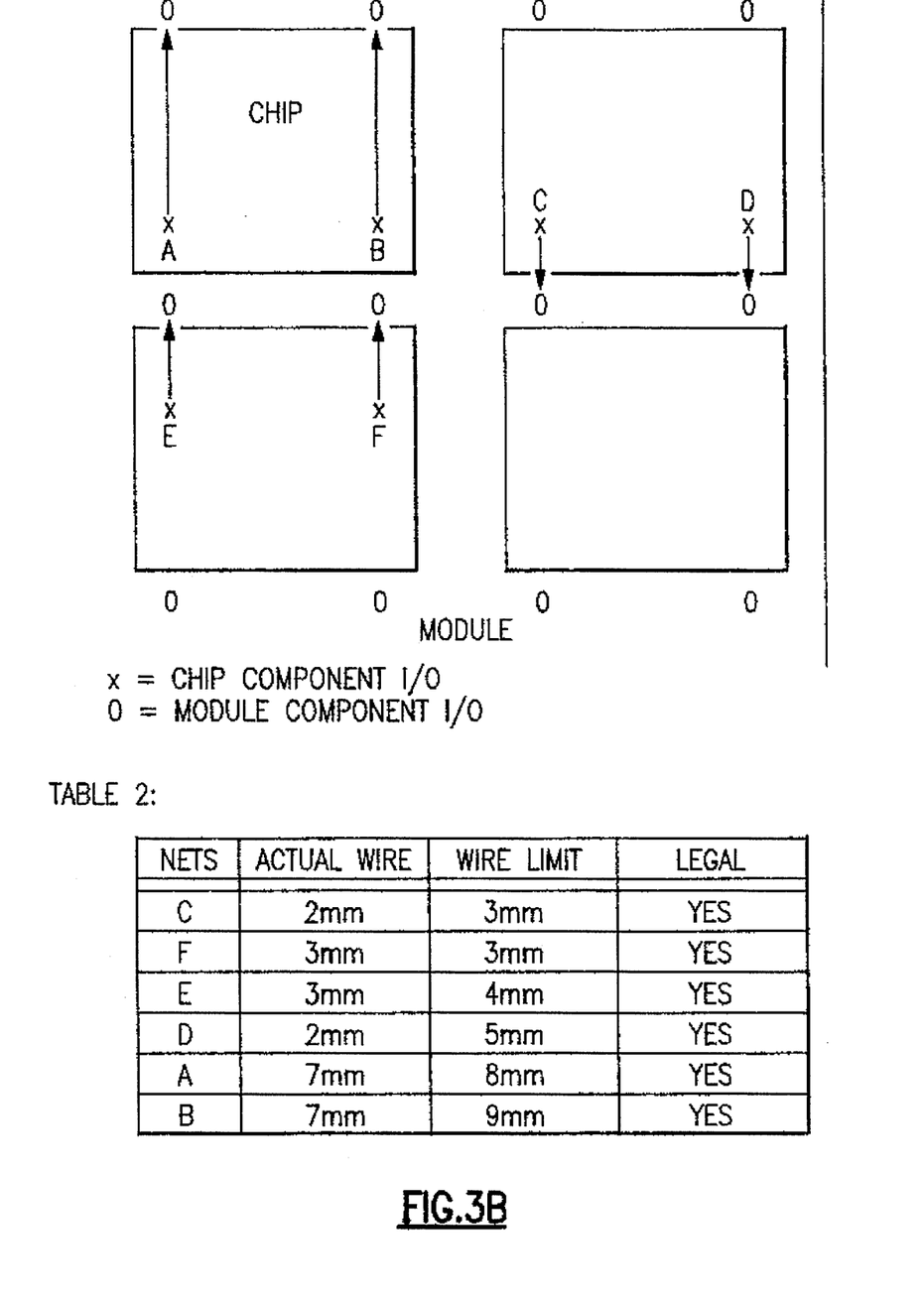

With the goal established of minimizing wiring length by I/O assignment, thereby preventing timing limits from being exceeded, the order in which nets are to be considered for assignment of I/Os must be addressed. FIGS. 3A and 3B illustrate how nets in close proximity to each other can have varying results depending on the order of assignment. Nets can require rework due to random module I/O assignment. FIG. 3A, TABLE 1 illustrates the results when assigning nets in the order from A to F. As illustrated in the Table 1 in FIG. 3A, there is an assignment of module I/Os to nets with no order of priority. I/Os are assigned to nets based on which is closest. The result is that Nets E and F are illegal and must be reworked by the designer. FIG. 3B TABLE 2 illustrates the results when assigning nets in the order based on shortest to longest wire length limit. Illegal nets can be eliminated by prioritization. Table 2 shows assignment of module I/Os to nets in order of shortest to longest wire limit. I/Os are assigned to nets based on which is closest. The result is that all nets are legal, eliminating the need for rework by the designer.

As a rule, the earlier a net is assigned an I/O, the closer the I/O is to the net and therefore the shorter the length of wire to make the the connection. It is therefore desirable to have the nets with more rigid design characteristics (lower maximum timing and larger capacitive loads) to be assigned I/Os earlier to meet design limits.

Figure 4:
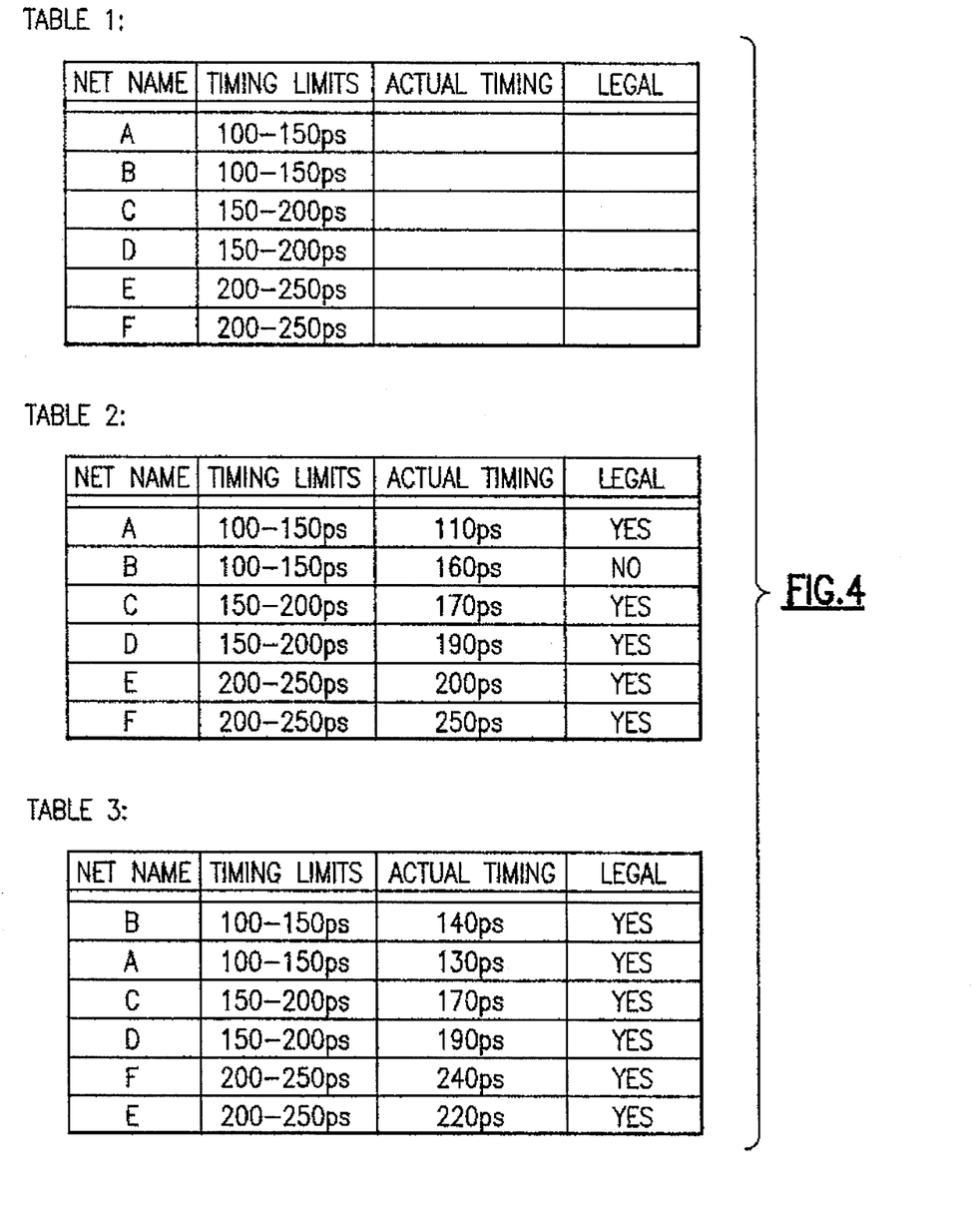
FIG. 4 shows that a net prioritization based on timing constraint and timing information can prevent nets from exceeding the constraints when I/Os are assigned.

FIG. 4 shows nets prioritized by a timing limit. An ordering or priority is established in which nets are assigned I/Os by design constraint. FIG. 4, TABLE 1 illustrates how nets are initially ordered by a timing limit, where nets A and B have a timing range of 100–150 picoseconds, nets C and D have a timing range of 150–200 picoseconds and nets E and F have a timing range of 200–250 picoseconds. FIG. 4, TABLE 2 shows the resulting information of I/Os being assigned in order from A–F. The results show that net B is illegal and net F has a a timing value close to the limit. FIG. 4, TABLE 3 shows that by changing the order (B prior to A to prevent B from failing the design limit, F prior to E to provide a larger margin of safety) all nets meet the design constraints.

Prioritizing the nets by timing constraint and by timing value allows as many nets as possible to meet the design constraints without violating the first goal of minimizing wire length to ensure timing limits are not exceeded. As the number of nets that are being considered increases, the value of net prioritization in reducing design cycle time is realized.

In addition to the general description of the goals of the methods and algorithms described, it may be worthwhile to illustrate, by way of example, some limitations which we have recognized with the prior art. We have discovered that consideration must be given to net priorities outside of timing for proper I/O assignment. Nets with strict wiring limits on a specific system level, for example, must be considered prior to all other nets, regardless of the order of I/O assignment established by timing information. Allowance must be made for any type of net priority that would supersede a priority by timing.

Figure 5:
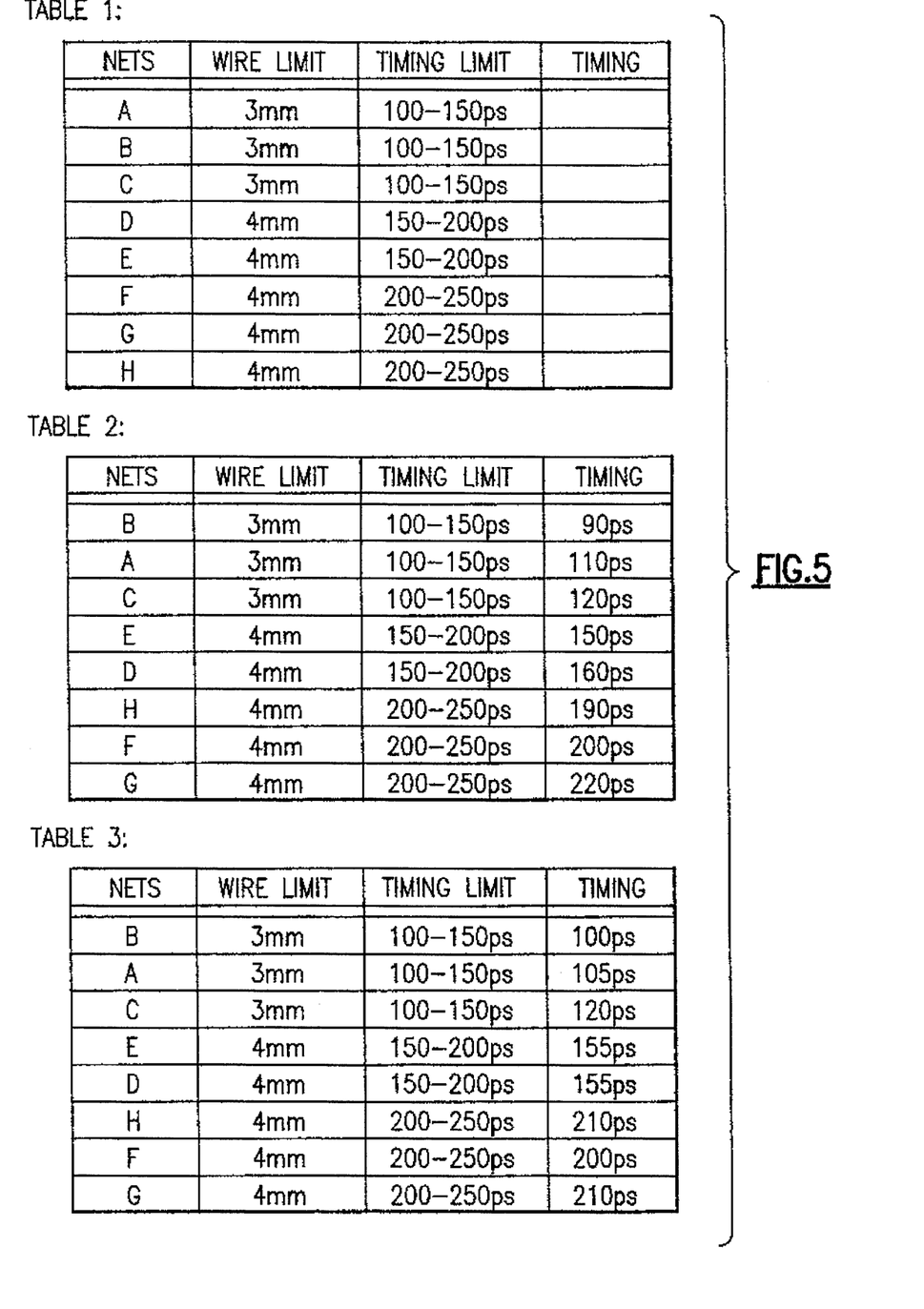
FIG. 5 shows that a designer specified net priority which supersedes timing information can prevent nets from exceeding the constraints when I/Os are assigned.

FIG. 5 shows prioritization of nets by length and timing constraint. The prioritization of nets using slack values helps to prevent illegal nets from being created through pool module I/O assignment. As an illustration, FIG. 5, TABLE 1 shows the prioritization of nets first by length limit and then by timing constraint. FIG. 5, TABLE 2 shows the results of the assignment by length limit and then by timing constraint. The nets are sorted by order of wire limit and then by timing information. Because nets B and F exceed the timing constraint, the assignment is done again in an attempt to make all nets legal. The assignment is done in the order the nets are listed in TABLE 2. FIG. 5, TABLE 3 shows the new order by timing information and that all nets are within the timing constraints.

A second limitation is that no consideration is given to estimation of component I/O locations at the lowest package level. The estimation of I/O locations where no actual assignment exists is necessary in the early stages of design. If a poor estimate of these locations is performed, wire length and timing information based on these estimates could differ dramatically when the actual locations become known. Otherwise, as we stated, the prior method results in many illegal and/or non-optimized nets, necessitating re-assignment of I/Os at one or more levels of the computer system.

Figure 6:
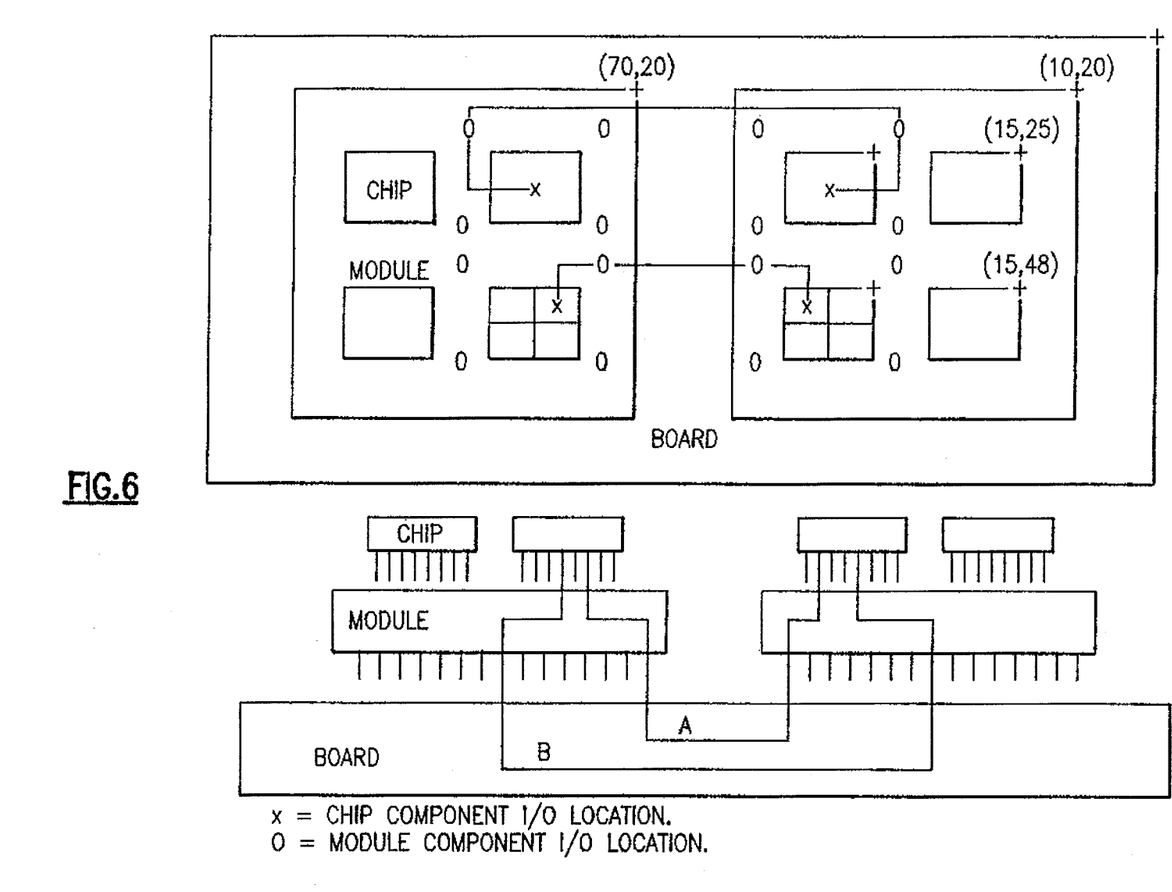
FIG. 6 shows that given the source and sink points of a net, a more accurate estimate of the component I/O location can be made, resulting in less wire contained in the net and a smaller probability the net will exceed design constraints.

Improving assignment and reducing wire knowing direction of paths is illustrated in FIG. 6. FIG. 6 shows the differences between a good and poor estimation of a chip component I/O. The wire connection for NET A is assigned estimated component I/Os that are consistent with the direction in which the connection is to be made. By comparison, NET B is assigned the center of the chip component as the estimated I/O location. The result is a less accurate estimated net wire length, which could result in a different priortization for assigning I/Os. More illegal nets could be realized, which would cause a longer design cycle time to correct these nets. Thus FIG. 6 illustrates knowing the overall direction and path of a connection can improve the assignment of package I/Os and reduce the amount of wire needed to make a connection.

Net B uses the center of the component as its initial component I/O locations. Because only the immediate package level is considered (the overall direction is not known), a poor assignment is made.

Net A uses estimated component I/O positions for the chip based on direction. As a result, the estimated component I/O locations are in sections of the component that reflect a better assignment. A better choice of module component I/O is made as a result of the improved initial chip component I/O location.

The Preferred Embodiment

As an overview of our preferred embodiment, we utilize a method for physical layout of elements of a computer system by assigning I/O pins for physical package design wherein all nets at each level of the computer system are assigned component I/O pins based on estimated wire length, electrical constraints and timing. Pursuant to the method we employ assignment of component I/O (input/output, the interface area between levels of physical packaging) pins for all components at each level of the computer system is determined by a hierarchical, top-down design method. The I/O pins for each computer system component are assigned to nets on a level of packaging, or between levels of packaging based on wire length, electrical limits and timing. Parameters that are considered are net priority (both the relative importance of a net to the system and the relative importance of a net to other nets in the system), location of physical components, location of physical component I/Os at all computer system levels of physical packaging hierarchy, and I/O pin characteristics. An iterative method which can be implemented by a process employed by a computer is used to assign and reassign I/O pins at each level based on timing. As I/Os are reassigned at each lower component level, new assignments are made at all higher levels of the system packaging hierarchy based on the changed parameters at the lower level. When I/Os are assigned within a computer system using the process described herein, the result will be few, if any, critical nets failing length, electrical or timing constraints due to poor I/O assignments. Our method has built in checks to avoid being trapped in an NP complete situation.

Figure 7:
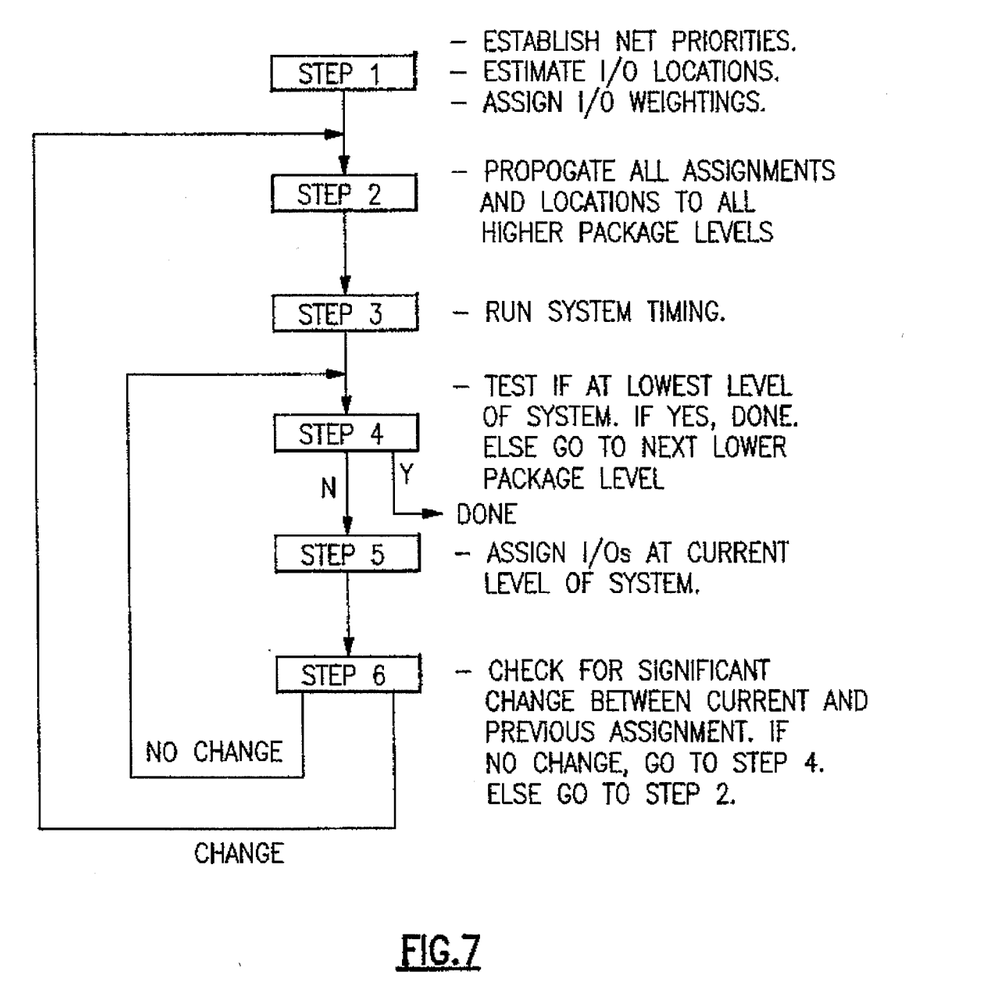
FIG. 7 shows a schematic flow chart showing the essential steps of the top down I/O assignment flow method in accordance with the invention.
Figure 8:
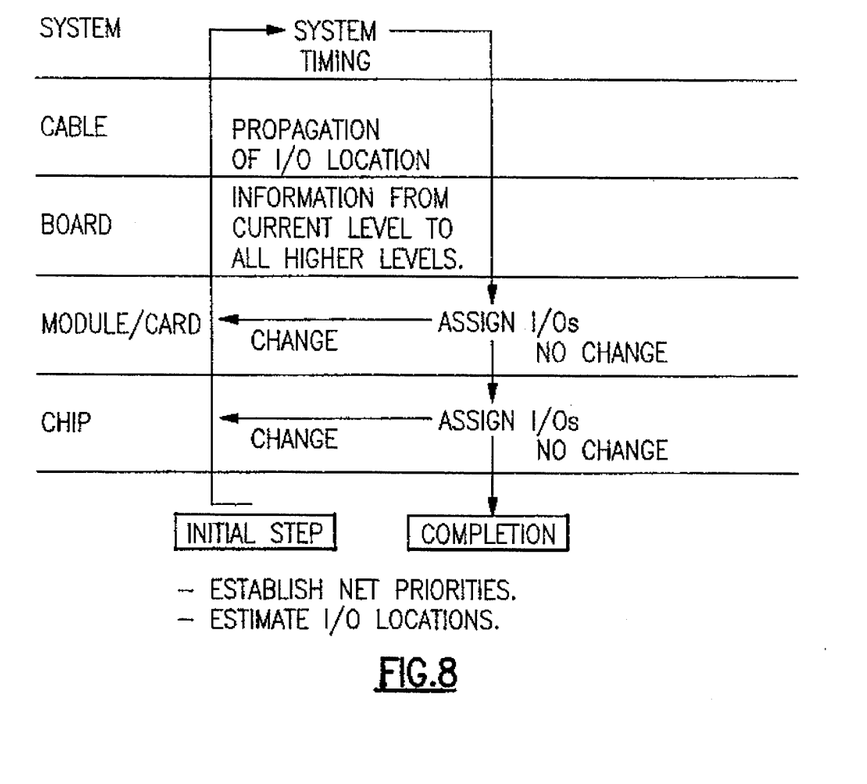
FIG. 8 is a flow diagram superimposed over a system with 3 levels of packaging (chip, module or card, board) flow superimposed on a system.

Looking at the invention in greater detail, FIG. 7 illustrates our preferred embodiment in which the top down assignment of input/output pins (I/O) is achieved with an overall flow of the method steps of the top-down methodology for assigning I/Os across the entire system. As shown in FIG. 7, the first step 1 of our method is an input from a user of the assignment method which defines or establishes net priorities. When a computer system is employed, the system then at this step estimates I/O locations.

Step 2 of the process, in the preferred embodiment using a computer program, propagates all assignments and locations to all of the higher package levels. As the process is iterative, if there is an output at the last step which shows that there is a needed change for I/O pin assignment, the output of that step (Step 6), becomes an input to Step 2.

During this step, the program propagates the assignment and location of the higher package levels for the needed changes. The output of this step is an input to Step 3.

The Step 3 of our method provides a run of the planned circuit computer system timing. The output of this step is an input to Step 4.

Step 4 is a test step. A test is made to determine if the results of Step 3 are legal with respect to the lowest level component of the system. (Design information describing the placement of components with respect to other components across the system is used to make this determination.) If the results are found to be legal, then the method is complete. An output is provided of the circuit plan. If the output of Step 4 is NO, the output is provided to Step 5.

Step 5 receives its input from Step 4 and assigns I/Os for the current level of the iterative process. The output of Step 5 is an input to Step 6.

Step 6 performs a comparison function. If there is no significant change between the current assignment of I/O pins and a previous assignment, then the output is provided as an input to Step 4. A test is then made to determine if the assignment occurred at the lowest level of the system, and if this is found to be true, then the output from Step 4 exits the system. Otherwise, the output is provided back (because a significant change occurred and new assignments are needed) to become an input to Step 2. There reassignment occurs and the process continues until all assignments from the top down are complete.

Step 1 of the method begins with accepting as input the placement of all components at each system level and the logical association of all nets in accordance with top-down design. Estimated I/O locations are calculated based on direction in which net wire has to travel to make a connection at the current and next levels of packaging hierarchy. Net priorities (apart from those determined by timing information) are established based on length or electrical constraint. Weighting based on characteristics of I/Os (ECability, capacitance, etc.) are also established.

Placement of components within the system is an action that is done at a higher design level, in which the system is partitioned by logical function.

The logical association of nets between components in the system should also be completed prior to executing this invention. It is only through this design information that estimated I/O locations can be improved knowing the source and sink points of a net.

Figure 9:
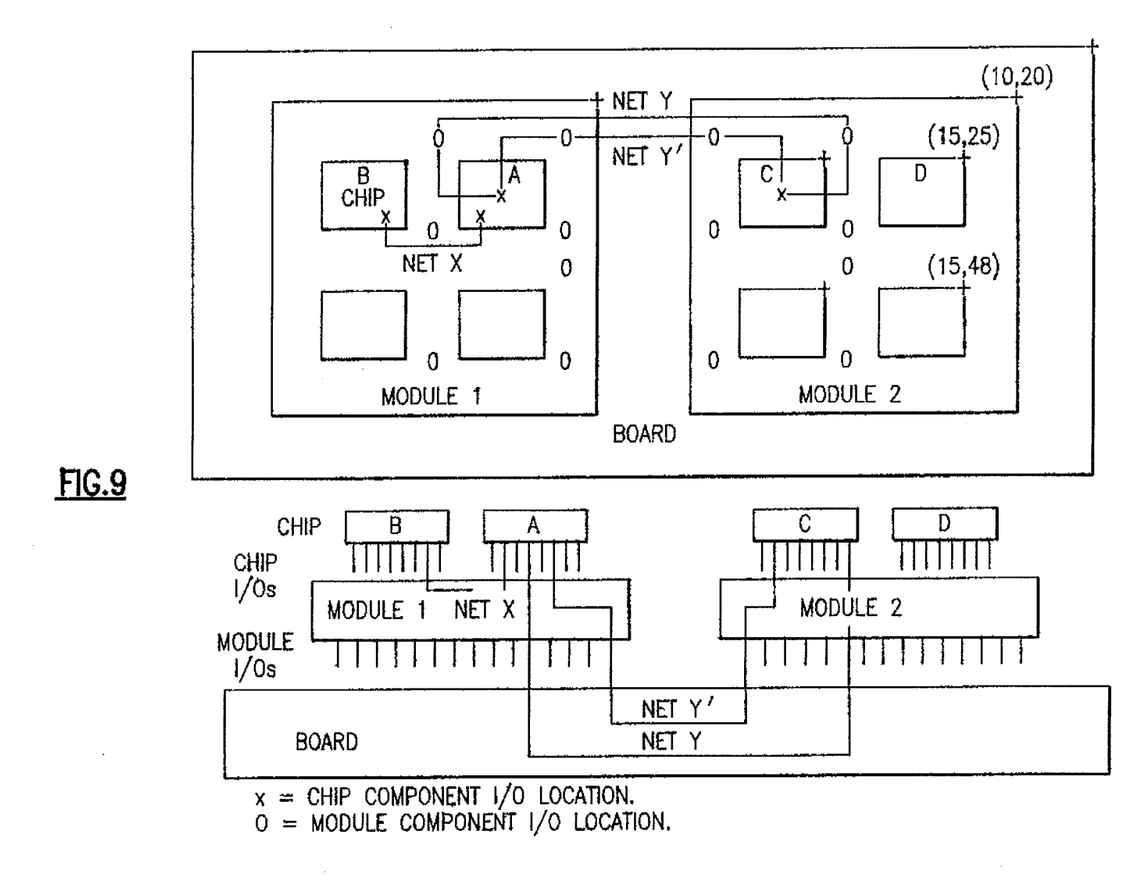
FIG. 9 illustrates the calculation of the length of wire between two I/Os at different levels.

Also used as input are the actual locations of I/Os for each component. It is assumed that I/Os are a fixed pad of the physical components. Wire lengths can be determined knowing the location of an I/O relative to its component, and the location of a component relative to the system. FIG. 9 illustrates the calculation of the length of wire between two I/Os at different levels. Note that a change of I/Os at module level affects Net Y, while Net X is unaffected. A change to the module component I/Os will change the wire lengths of Net Y. Net X is unaffected and its length and timing do not have to be recalculated.

I/O locations are estimated as described in FIG. 6 and the previous discussion.

Net Priorities are created by the user based on information regarding timing, wiring and capacitance constraints. These constraints are used as inputs to the user's decsions as to how to prioritize nets. Net priorities are assigned as described in FIG. 5. This invention assumes that design constraints are part of the design data and can be stored in tabular form as shown in FIG. 5.

Step 2 illustrates how the assignment of I/Os at a lower package level need to be propagated to the higher package levels. This occurs because as the lower level I/O positions change, the wire lengths for the nets at higher levels will change because of the new I/O locations.

Figure 10:
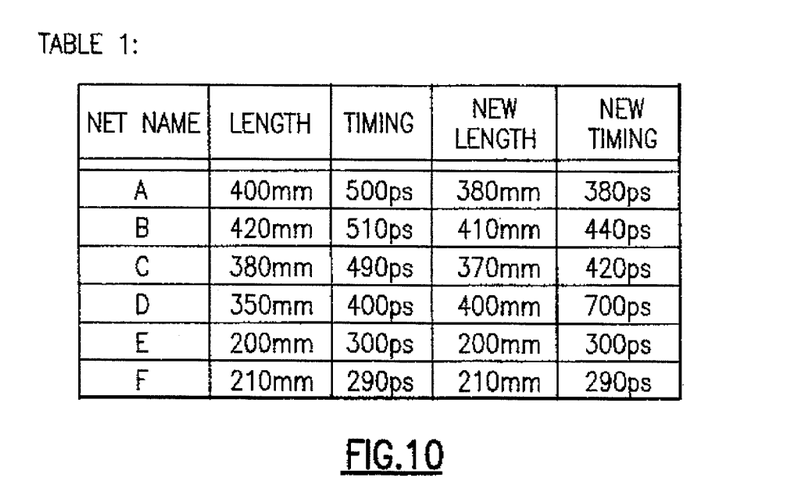
FIG. 10 illustrates how length affects the timing values for a net. In this example, only the module I/O assignments have changed. Nets A–D have module I/Os and therefore there lengths will change with new assignments. Nets E and F do not contain module I/Os and are unaffected.

The example in FIG. 3 shows how timing is effected as wire lengths change. Therefore, any change in lengths requires that new timing values be calculated. FIG. 10, TABLE 1 illustrates how nets at higher levels across the entire system are affected by lower level assignments. The length values for each net re-calculated based on the changes. For the initial invocation of this step, wire lengths for all levels from the lowest to the highest are caculated and stored as illustrated in FIG. 10, TABLE 1. In this example, only the module I/O assignments have changed. Nets A–D have module I/Os and therefore there lengths will change with new assignments. Nets E and F do not contain module I/Os and are unaffected.

In step 3, system level timing is executed and slack (the difference between the required arrival time and the actual arrival time) values are stored in a table as illustrated in FIG. 2, TABLE 1. As illustrated in FIG. 2, the slack values are the information used to establish a net priority based on timing. The nets with the smallest slack values have the highest priority for assignment.

In step 4, a test is made to determine if the methods have arrived at the lowest package level. If not, move to the next lowest level and assign I/Os at that level. Otherwise, the assignments of component I/Os at all levels is complete. As discussed, design information is received as an input to determine the lowest level of component in the system.

In step 5, I/Os are assigned at the next highest level based on the net priority established by length and electrical constraint, and by timing information. This is illustrated in FIGS. 3 and 4.

Step 6 checks to see if the assignment at this level has resulted in a significant change to the previous I/O assignment. This check is for an increase in the number of nets which violate constraints. In addition, the slack values are compared to timing limits. If each is sufficiently under the limit, as illustrated in FIG. 5, then move to the next lower level. Otherwise, repeat the process beginning at step 2. Any significant change to the I/Os assigned at the current level will cause net wire lengths and the timing information based on those lengths to change at all higher levels. This is the reason why the methodology needs to be iterative.

While we have described our preferred embodiments of our invention, it will be understood that those skilled in the art, both now and in the future, may make various improvements and enhancements which fall within the scope of the claims which follow. These claims should be construed to maintain the proper protection for the invention first disclosed.

What is claimed is:

1. A method of assigning I/O pins for a physical circuit package system having multiple levels of packaging hierarchy, including a highest level and a lowest level wherein lower levels of packaging communicate with each other via higher levels of packaging, comprising the steps of:

(a) inputting net priorities into an iterative assignment process for making I/O pin assignments for connections between packages in the circuit package system, and starting at the highest level of packaging for the physical circuit package system, and moving progressively to lower levels until completed wherein successively lower levels each become the current level in sequence from the highest level to the lowest level, iteratively processing assignment of I/O pins for each level when such level becomes the current level until the I/O pins are stabilized, via steps of:

(b) propagating all I/O pin assignments to all higher level packaging of the physical circuit package system, (c) running system timing with the I/O pin assignment and locations used during the preceding propagating step, (d) determining if the run was performed at the lowest level, and if the run was performed at the lowest level, exiting from the method at the lowest level as stabilized I/O pin assignments for the physical circuit package, and if the run was not performed at the lowest level (e) moving to a lower level in said sequence to make such lower level the current level, making the I/O pin assignments for the current level of packaging, and then (f) checking the I/O pin assignments for any significant change between the I/O pin assignments after step (e), and the previous assignments for the current level of packaging immediately before step (e), and if there was no change, providing the I/O pin assignments for the current level to the testing step (d) of the process, and if there was a change providing the I/O pin assignments for the current level to the propagating step (b) of the process whereupon the I/O pin assignments are processed by step (b) and a succeeding step (c) of the process.

2. The method according to claim 1 wherein the inputting step includes user established net priorities and estimated I/O locations and I/O weighting for assignment of locations.

3. The method according to claim 1 wherein the multiple levels include, from the highest level of the system of the circuit package, additional levels in descending order, including, in descending order a cable level, a board level, a module or card level, and a chip level for which the net priorities are established and I/O pin location assignments provided as a result of the process.

4. The method according to claim 1 wherein the step (b) propagates all assignments of pin locations to all of the higher package levels, and as the process is iterative, if there is an output at checking step (f) which shows that there is a needed change for I/O pin assignment, the output of checking step (f) becomes an input to propagating step (b), and during step (b), the program propagates the assignment an location of the higher package levels for the needed changes, resulting in an output of propagating step (b) which is an input to testing step (c).

5. The method according to claim 4 wherein the method begins with inputting a planned placement of all components at each system level and a logical association of all nets in accordance with top-down design.

6. The method according to claim 5 wherein in propagating step (b) estimated I/O locations are calculated based on direction in which net wire has to travel to make a connection at the current and next levels of packaging hierarchy.

7. The method according to claim 5 wherein in propagating step (b) net priorities, apart from net priorities determined by timing information, are established based on length or electrical constraint.

8. The method according to claim 5 wherein in propagating step (b) weighting based on physical characteristics of I/O pins which would affect performance are also established.

9. The method according to claim 5 wherein in propagating step (b) the I/O pin assignments and locations of the I/O pin assignments at the current level are propagated to each higher package level so that wire lengths and timing are re-calculated at the higher levels, and when step (b) is initially invoked in the method, placement and net priority information are used for the current level being the highest package level, and wherein subsequent invocations of step (b) cause component I/O locations at the current level to be propagated to the highest level.

10. The method according to claim 5 wherein in timing run step (c) system level timing is executed and slack values which represent the difference between a required arrival time and an actual arrival time are propagated to all package levels.

11. The method according to claim 5 wherein in timing run step (c) slack values are used to establish a net priority based on timing wherein nets having the smallest slack values have the highest priority for assignment.

12. The method according to claim 5 wherein net priorities are established independent of timing information and nets are given priority based on wire length constraints a necessity to minimize skew representing timing differences between a group of nets, or net type that indicates a critical or non-critical net.

* * * * *